Dec. 6, 1966

T. J. DAVEY 3,289,446

LEAD FORMING TOOL

Filed Nov. 26, 1963

INVENTOR

Thomas J. Davey

BY Edwin E. Greigg

ATTORNEY

United States Patent Office 3,289,446
Patented Dec. 6, 1966

3,289,446
LEAD FORMING TOOL
Thomas J. Davey, 67 Taunton Road, Fairfield, Conn.
Filed Nov. 26, 1963, Ser. No. 325,990
4 Claims. (Cl. 72—36)

This invention relates to improvements in tools for locating spaced points and, more particularly, to a device for determining the location of plural apertures or perforations in printed circuit boards and subsequently forming, with the cooperation of elements carried by said tool, the leads of electrical components to a size appropriate to be inserted in the printed circuit board.

According to present practices, printed circuits as known in the electronics field, whether for use in radio and television equipment or in non-radio/television devices such as missiles, weapon systems, ordnance electronics, etc., comprise thin, flat portions of strips of conductive material arranged in a predetermined pattern on one side of a supporting panel of non-conductive material. Circuit components are mounted on the other side of the panel and have leads which pass through the panel and are soldered to appropriate connection points in the printed wiring.

It is also known in the art to provide machines for facilitating assembly of various electrical components, such as detector coils, inductances, capacitors, resistors, cross-over linking wires, etc., all of which have connecting means or leads which pass through the appropriate perforations in the conductive strip of the circuit board. Subsequently, the board is dipped in an appropriate manner to solder the leads to the conductive strips. However, the present inventive concept relates to improvements in a manual operation of forming the aforementioned electrical components in a manner not heretofore known.

Accordingly, it is the principal object of this invention to provide a tool particularly for locating spaced perforations in a printed circuit board of the non-radio/television type such as missiles, weapon systems, ordnance electronics and thereafter, with the information derived from this operation, quickly and accurately forming the leads of an electrical component to be received in the perforations.

Another object of the invention is to provide an improved tool having spaced, forming means for leads of electrical components, the distance between the forming means being simultaneously established upon determining the location of the perforations in the circuit board.

Still another object of the invention is to provide an improved tool which will create a 90 degree bend in the leads of the electrical components in spaced relation to the body thereof without distortion of that portion of the lead which extends axially of the body.

A further object of the invention is to provide an improved tool of the type described which includes relatively movable members and means coacting with each of the members to prevent inadvertent movement of one member relative to the other subsequent to determination of the distance between the spaced perforations and the time the forming step takes place.

The details of the invention, as well as additional objects and advantages, will be clearly understood with reference to a preferred embodiment illustrated in the accompanying drawings employing similar reference numerals to identify the same elements in each of the several views, and in which.

Figures 1, 2, 3, 4, 5, 6, 7, 8, 9, 10:
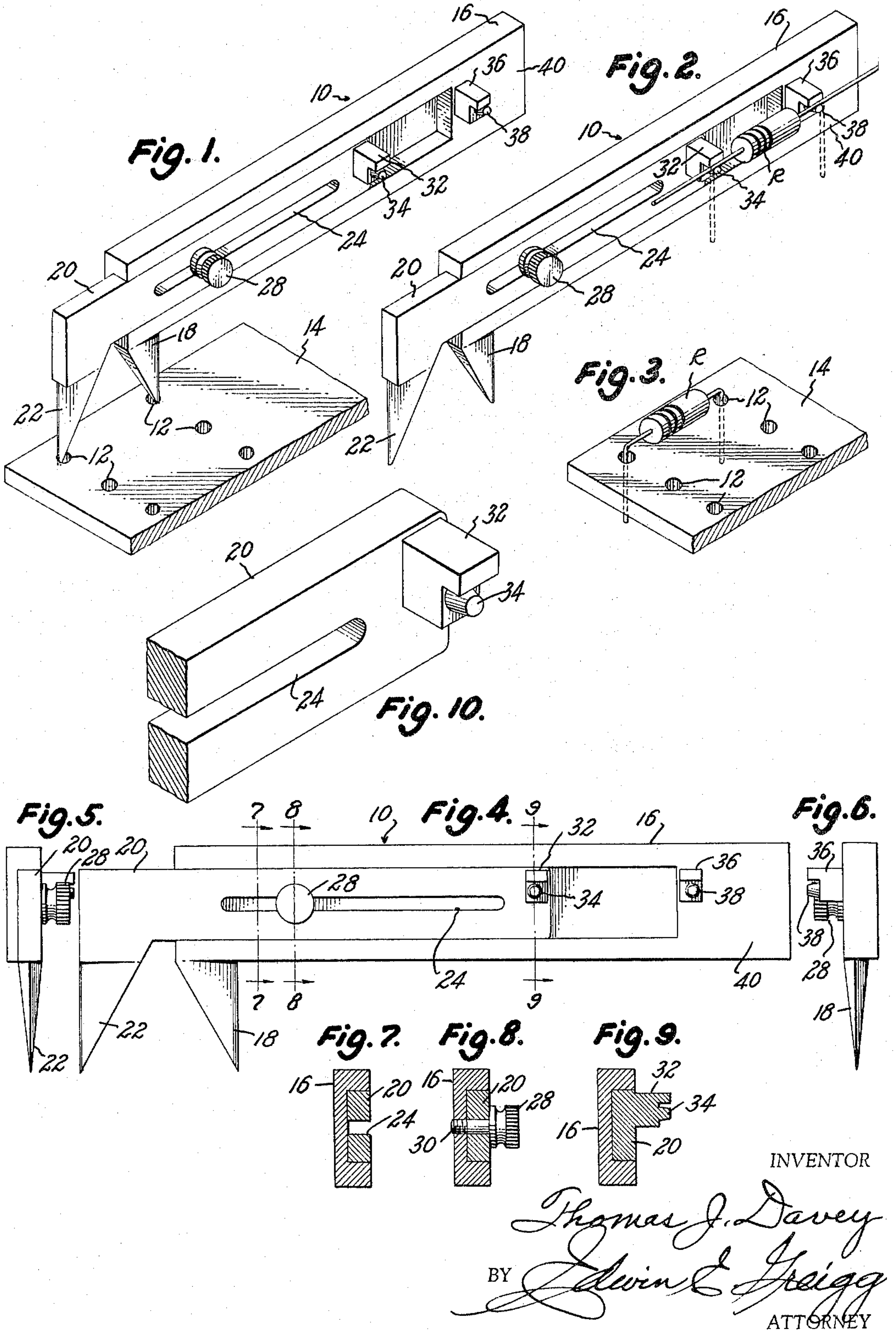
FIG. 1 is a perspective view of the improved tool shown in cooperative relation with a printed circuit board.
FIG. 2 is a perspective view of the tool showing the electrical component in full lines and also with its lead lines bent into phantom lines.
FIG. 3 shows a printed circuit board with the formed leads of the electrical component inserted therein.
FIG. 4 is an enlarged side elevational view of the improved tool.
FIG. 5 is an end elevational view of one end of the tool.
FIG 6 is an end elevational view of the opposite end of the tool.
FIG 7 is a cross-sectional view on line 7—7 of FIG. 4.
FIG. 8 is a cross-sectional view on line 8—8 of FIG. 4.
FIG. 9 is a cross-sectional view on line 9—9 of FIG. 4.
FIG. 10 is an enlarged fragmentary view clearly showing the lead-forming means.

Referring to FIG. 1, there is illustrated in this view an improved tool generally shown at 10 for determining spaced points or perforations in a printed circuit board, a fragmentary portion of which is shown at 14. The improved tool 10 comprises an elongated body member 16 which is generally U-shaped in cross-sectional area for the greater portion of its length and includes as an integral part thereof adjacent to one end and normal thereto an offstanding pointer 18.

The elongated U-shaped body member 16 is adapted to receive in slidable relation therewith an elongated relatively thin member 20 which also includes as an integral part thereof another pointer 22 which extends normal thereto and which is coplanar to the aforesaid pointer 18. The element 20 is provided with an elongated slot such as that shown at 24 and thereby adapted to receive a shank portion 26 of the knurled thumb screw 28, the threaded portion of which is seated in the threaded bore 30 provided in member 16 (see FIG. 1).

With further reference to FIG. 1, it will be observed that the integral pointers 18 and 22 are shown as inserted into spaced perforations 12—12 of the printed circuit board, at which time the thumb screw 28 would be tightened to prevent movement between body member 16 and the slidable portion 20 telescopically housed therein.

At the opposite end of slidable member 20 there is formed as an integral part thereof an inverted generally L-shaped distortion preventing element 32, the purpose of which will become apparent as the description progresses, and which, in turn, is provided with a frusto-conical lead-forming means 34.

The elongated member 16, which is adapted to slidably house slotted mmeber 20, is also provided with an integrated substantially L-shaped element 36 of the same configuration as element 32, and also includes a frusto-conical lead-forming means 38 which is positioned normal to the surface 40 and coplanar with the aforementioned frusto-conical member 34.

*Operation*

In use of the improved tool described hereinbefore, it is merely necessary for an operator to loosen the thumb screw 28 thus enabling slotted member 20 to slide freely relative to the elongated body member 16 and with one hand the pointers 18 and 22 may be adjusted to register with any two of the perforations in the printed circuit board depending upon the electrical component to be assembled therewith. Subsequently, when the distance between the several perforations has been determined, the thumb screw 28 is once again tightened thus spacing the offstanding distortion preventing elements 32 and 36 and their companion frusto-conical lead forming elements 34 and 38 in predetermined relation. Thereafter the electrical component shown as a resistor "R" is inserted between these forming elements (see FIG. 2) and the leads are quickly bent from the full line position shown into the dotted line position. The resistor is now lifted from the forming members and inserted in the printed circuit board as clearly illustrated in FIG. 3.

It is contemplated that this tool may be constructed by various means such as stamping, die-casting, molding, etc.

Although only one embodiment of the invention has been depicted and described, it will be apparent that this embodiment is illustrative in nature and that a number of modifications in the apparatus and variations in its end use may be effected without departing from the spirit or scope of the invention as defined in the appended claims.

What I claim is:

1. A tool for locating spaced openings in a printed circuit board and to determine therefrom sizes of elements to be assembled in said openings comprising a body member including relatively movable means, one of said means including an immovable locating means extending normal to said body and adapted for insertion in an opening in the printed circuit board, and the other of said means including a movable locating means extending normal to the body and coplanar with said first locating means, and other means ararnged in spaced relation to said relatively movable spaced opening locating means for forming an element of a size for use in said spaced openings.

2. A tool for locating spaced openings in a printed circuit board as claimed in claim 1, wherein said relatively movable means comprise slidably arranged means.

3. A tool for locating spaced openings in a printed circuit board as claimed in claim 2, wherein said slidably arranged means include cooperating lock means preventing inadvertent movement between said slidable means.

4. A tool for locating spaced openings in a printed circuit board as claimed in claim 1, wherein said other means arranged in spaced relation to said relatively movable spaced opening locating means include a pair of lead forming elements which extend normal to said body member with one each of said lead forming elements being associated with the relatively movable means.

References Cited by the Examiner

UNITED STATES PATENTS

| | | | |
|---|---|---|---|
| 507,454 | 10/1893 | Rogers | 140—102.5 |
| 1,424,492 | 8/1922 | Leschen | 33—143 |
| 2,415,821 | 2/1947 | Hoffman | 33—143 |
| 3,151,398 | 10/1964 | Torrey | 72—36 |

CHARLES W. LANHAM, *Primary Examiner.*

L. A. LARSON, *Assistant Examiner.*